(12) United States Patent
Sinha et al.

(10) Patent No.: US 9,362,880 B2
(45) Date of Patent: Jun. 7, 2016

(54) MANUFACTURING METHOD OF AN ARRAY OF BAW RESONATORS WITH MASK CONTROLLED RESONANT FREQUENCIES

(76) Inventors: Rajarishi Sinha, Pittsburgh, PA (US); L. Richard Carley, Sewickley, PA (US); Deok-Yang Kim, New Brunswick, NJ (US)

( * ) Notice: Subject to any disclaimer, the term of this patent is extended or adjusted under 35 U.S.C. 154(b) by 1152 days.

(21) Appl. No.: 13/326,777

(22) Filed: Dec. 15, 2011

(65) Prior Publication Data

US 2012/0079692 A1    Apr. 5, 2012

Related U.S. Application Data

(62) Division of application No. 12/721,914, filed on Mar. 11, 2010, now abandoned.

(60) Provisional application No. 61/159,188, filed on Mar. 11, 2009.

(51) Int. Cl.
*H03H 3/02*      (2006.01)
*H03H 9/15*      (2006.01)
(Continued)

(52) U.S. Cl.
CPC .............. *H03H 3/04* (2013.01); *H03H 3/007* (2013.01); *H03H 3/0076* (2013.01); *H03H 3/02* (2013.01); *H03H 9/15* (2013.01); *H03H 9/205* (2013.01); *H03H 9/171* (2013.01); *H03H 2003/027* (2013.01); *H03H 2003/045* (2013.01); *H03H 2003/0414* (2013.01); *H03H 2003/0442* (2013.01); *H03H 2003/0478* (2013.01); *Y10T 29/42* (2015.01); *Y10T 29/49005* (2015.01); *Y10T 29/49009* (2015.01); *Y10T 29/49147* (2015.01); *Y10T 29/49155* (2015.01)

(58) Field of Classification Search
CPC ....... H03H 3/007; H03H 3/0076; H03H 3/02; H03H 3/04; H03H 2003/027; H03H 2003/0414; H03H 2003/0442; H03H 2003/045; H03H 2003/0478; H03H 9/15; H03H 9/171; H03H 9/205; Y10T 29/42; Y10T 29/49005; Y10T 29/49147; Y10T 29/49155; Y10T 29/49009
See application file for complete search history.

(56) References Cited

U.S. PATENT DOCUMENTS

| 2,870,521 A | 1/1959 | Rudnick |
| 4,638,205 A | 1/1987 | Fujita et al. |

(Continued)

FOREIGN PATENT DOCUMENTS

JP    2008079294 A  *  4/2008

*Primary Examiner* — A. Dexter Tugbang
(74) *Attorney, Agent, or Firm* — Lerner, David, Littenberg, Krumholz & Mentlik, LLP

(57) ABSTRACT

Methods that create an array of BAW resonators by patterning a mass load layer to control the resonant frequency of the resonators and resonators formed thereby, are disclosed. Patterning the surface of a mass load layer and introducing apertures with dimensions smaller than the acoustic wavelength, or dimpling the mass load layer, modifies the acoustic path length of the resonator, thereby changing the resonant frequency of the device. Patterns of variable density allow for further tuning the resonators and for individualized tuning of a resonator in an array of resonators. Patterning a reflowable material for the mass load layer, thereby providing a variable pattern density and distribution followed by elevating the temperature of the mass load layer above its melting point causes the material to liquefy and fill into the apertures to redistribute the mass load layer, thereby, upon subsequent cooling, providing resonators with a predetermined desired resonant frequency.

17 Claims, 12 Drawing Sheets

(51) Int. Cl.
  *H03H 3/04* (2006.01)
  *H03H 3/007* (2006.01)
  *H03H 9/205* (2006.01)
  *H03H 9/17* (2006.01)

(56) References Cited

U.S. PATENT DOCUMENTS

| | | |
|---|---|---|
| 4,642,505 A | 2/1987 | Arvanitis |
| 5,587,620 A | 12/1996 | Ruby et al. |
| 5,894,647 A | 4/1999 | Lakin |
| 6,377,137 B1 * | 4/2002 | Ruby ................ H03H 3/02 |
| 6,469,597 B2 | 10/2002 | Ruby et al. |
| 6,566,979 B2 | 5/2003 | Larson, III et al. |
| 6,604,266 B1 | 8/2003 | Tajima et al. |
| 6,657,363 B1 | 12/2003 | Aigner |
| 7,245,057 B2 | 7/2007 | Ma et al. |
| 7,489,063 B2 | 2/2009 | Isobe et al. |
| 7,675,389 B2 | 3/2010 | Yamakawa et al. |
| 2004/0021403 A1 * | 2/2004 | Ayazi et al. ............ H03H 3/02 |
| 2008/0143215 A1 * | 6/2008 | Hara et al. ............. H03H 3/04 |

* cited by examiner

48

MANUFACTURING METHOD OF AN ARRAY OF BAW RESONATORS WITH MASK CONTROLLED RESONANT FREQUENCIES

CROSS REFERENCE TO RELATED APPLICATIONS

The present application is a divisional of U.S. patent application Ser. No. 12/721,914, filed Mar. 11, 2010, which claims the benefit of the filing date of U.S. Provisional Patent Application No. 61/159,188 filed Mar. 11, 2009, the disclosures of which are hereby incorporated herein by reference.

FIELD OF THE INVENTION

The present invention relates to bulk acoustic wave resonators and, more particularly, to a set of multiple BAW resonators with mask-controlled resonant frequencies.

BACKGROUND OF THE INVENTION

Thin film bulk acoustic wave (BAW) resonators that are used in oscillators and filters can deviate from their designed resonant frequency due to manufacturing variations in the thickness and material properties of their constituent films (also referred to as material layers or simply layers) by thousands of ppm or even more. This deviation in resonant frequency needs to be corrected to within a specified tolerance before the resonators are used in their intended applications.

The series resonant frequency (referred to as the resonant frequency and noted Fs or fs in this document) of a thin film bulk acoustic resonator (FBAR) with very thin electrodes in the thickness-extensional mode (the mode perpendicular to the resonator layer thicknesses) is given by $fs=\sqrt{(c/\rho)}/(2L)$, where c is the stiffness, $\rho$ is the mass density, and L is the thickness of the piezoelectric layer. In this canonical FBAR, the thickness-extensional mode acoustic waves are confined to the piezoelectric layer, so the acoustic path length is simply the thickness of the piezoelectric layer, L.

The series resonant frequency equation presented above is modified when electrodes cannot be assumed to be very thin, or if the resonator is constructed in a surface mounted resonator (SMR) or double SMR (DSMR) configuration. However, the equation still shows a strong dependence of resonant frequency on material properties (c, $\rho$) and layer thickness (L) for each material present in the acoustic path.

The resonant frequency of a resonator can be altered by altering its acoustic path length, either by changing the thickness of one or more layers of material present in the acoustic path, or by changing the properties of that/those material(s). Changing the thickness of a material layer is commonly referred to as changing the "mass load" of the resonator or as "mass loading" the resonator, and the material that undergoes the thickness change is commonly referred to as the "mass load" layer. An increase in the acoustic path length leads to a decrease of the resonant frequency. FIG. 1 contrasts the acoustic path lengths for three prior art devices 10, 20, and 30. Comparing device 20 to device 10, the acoustic path length of device 20 is increased over that of device 10 because mass load layer 22 is added over electrode 16. Note that mass load layer 22 can be either an insulator or a conductor. Comparing device 30 to device 10, the electrode 16 is replaced with layer 26, which can increase or decrease the acoustic path length depending on the physical properties of layers 16 and 26.

As stated above, the acoustic path length of a resonator depends on the choice of materials and thickness of layers of the resonator and the distribution of acoustic energy within the device at the resonant frequency. A frequency shift is caused by altering either the material properties or the thickness of the layer or layers. The primary acoustic path is the portion of the main body of the resonator that contains significant portions of the resonant standing wave energy, which in the case of FBARs would be the electrodes and the piezoelectric layer, as well as any temperature drift compensating layers present in the FBAR stack. In an SMR (solidly mounted resonator) or DSMR (double solidly mounted resonator), the primary acoustic path would include those portions of the Bragg reflector layers that contain significant portions of the acoustic energy of the resonator.

As stated above, one or more mass load layer can be inserted into the acoustic path of any BAW resonator in order to decrease the resonant frequency. One example of such a layer is layer 22 in FIG. 1. The secondary acoustic path is the portion of the mass load layer(s) that contains significant portions of the resonant standing wave energy. The primary acoustic path is illustrated as 48 and the secondary acoustic path is illustrated as 50 in FIG. 3. The primary and secondary acoustic paths taken together form the complete acoustic path of the resonator, which is illustrated as 12 on device 20 in FIG. 1.

Prior art methods for modifying the acoustic path length can be classified based on whether the resonator acoustic path length is modified by altering the overall physical thickness of layers making up the resonator, or by changing the material properties of layers in the acoustic path, or both.

In one known approach, extra material is added on top of the top electrode of the resonator such as layer 22 in FIG. 1, thus increasing the overall thickness and hence the acoustic path length. This material may be an extra layer of material that is added adjacent to an electrode of the resonator, or an existing layer (such as an electrode layer) is thickened. Both approaches have the effect of reducing the resonant frequency. U.S. Pat. No. 5,894,647 to Lakin et al, entitled "Method for Fabricating Piezoelectric Resonators and Product", which issued on Apr. 20, 1999, describes a method of changing the thickness of an electrode to shift the resonant frequency. Electrodes of different thicknesses can be deposited on top of a resonator to create a range of different resonant frequencies in an array of resonators. U.S. Pat. No. 6,469,597 to Ruby et al, entitled "Method of Mass Loading of Thin Film Bulk Acoustic Resonators (FBAR) for Creating Resonators of Different Frequencies and Apparatus Embodying the Method", issued on Oct. 22, 2002 describes a method of mass-loading the lower electrode (e.g., 18 in FIG. 1) to shift the resonant frequency. That is, by adding a layer beneath the bottom electrode of the FBAR the overall acoustic path length of the FBAR is increased.

Other methods ablate or remove material from the acoustic path to change the resonant frequency of the device. U.S. Pat. No. 5,587,620 to Ruby et al, entitled "Tunable Thin Film Acoustic Resonators and Method for Making the Same", which issued on Dec. 24, 1996, describes a method of changing the resonant frequency by using resistive heating elements. The heating elements evaporate a tuning layer over time, until the resonant frequency has come into the desired range or value. Another method uses a laser to ablate or partially remove the electrode material, or some other mass load or sacrificial material. One exemplary patent that describes this method is U.S. Pat. No. 4,642,505 to Arvanitis, entitled "Laser Trimming Monolithic Crystal Filters to Frequency", which issued on Mar. 5, 1984.

Other methods involve progressively altering the material properties of the mass load to change the resonant frequency. For example, U.S. Pat. No. 6,566,979 to Larson et al., entitled "Method of Providing Differential Frequency Adjusts in a Thin Film Bulk Acoustic Resonator (FBAR) Filter and Apparatus Embodying the Method", which issued May 20, 2003, describes a method by which the material of the top electrode is oxidized, thereby changing its acoustic properties. Only the upper portion of the electrode is altered, leaving the remainder of the electrode to conduct current.

Still other methods contemplate patterning part of the resonator using one or more lithography steps to selectively remove material from the acoustic path and alter the resonant frequency. One example of this approach is described in U.S. Pat. No. 6,657,363 to Aigner, entitled "Thin Film Piezoelectric Resonator", issued on Nov. 8, 2000. In this approach, material is selectively removed from a mass load layer deposited on the electrode to alter the resonant frequency.

Because the resonant frequency of BAW resonators depends on the thickness of the layers making up the device, and because available semiconductor manufacturing equipment deposits materials with both cross wafer and wafer-to-wafer variations in the thickness of every layer, it is not practical to batch manufacture BAW resonators and achieve high yield when the accuracy required of resonant frequency is significantly smaller than 1% (i.e., 10,000 ppm of the frequency).

Drawbacks of these prior art methods can be categorized by increased manufacturing cost and complexity, and the limited accuracy achieved.

Methods that add extra mass to the top of the resonator are limited in the number and range of different resonant frequencies that they can span by the set of binary combinations of the number N of mass load layers in their manufacturing process ($2^N$). Placing multiple mass load layers on the resonator adds significant cost and complexity to the manufacturing process. In addition, when multiple mass load layers are used there must be an etch process that can remove one mass load layer and stop with a good selectivity on the prior mass load layer, or the mass load layer must consist of a bilayer.

Methods that remove material from the acoustic path require expensive test equipment to carefully calibrate the amount of material to be removed. Also, such methods can require additional functional elements around the main resonator to achieve the removal of material. This adds to the cost and complexity of the manufacturing process.

Methods that alter the material properties of layers in the acoustic path require expensive processing equipment to carefully control the chosen material property, without causing undesirable changes in the material properties of other layers. Further, changes in the material properties that control the resonant frequency can cause undesirable changes in other metrics of resonator performance, such as the quality (Q) factor.

Finally, known patterned mass load methods involve the removal of material throughout the thickness of the mass load layer, which is often the electrode layer itself. This can cause undesirable changes in the Q factor. Thus, a method for adjusting the resonant frequency of an array of resonators that does not suffer from these deficiencies is sought.

SUMMARY OF THE INVENTION

The approaches described above can adjust the resonant frequency of BAW resonators but do not provide a controlled resonant frequency offset between nearby resonators. The method described herein can be used to adjust the resonant frequencies of an array of resonators as described below. As described herein, a secondary acoustic path is used to locally adjust the resonant frequency of a resonator in an array of resonators. Controlled changes in the secondary acoustic path also provide the ability to create a spread of resonant frequencies over an array of resonators as well as to shift all of their resonant frequencies together.

In accordance with embodiments of the present invention, there is provided a set of methods that create an array of resonators using only one masking step. In exemplary methods, the masking step is used to pattern a mass load layer, dimple a mass load layer or re-flow a mass load layer. In certain embodiments, this mass load layer is also the upper electrode.

In a specific embodiment, small holes are etched in a mass load layer. The small holes have dimensions smaller than the acoustic wavelength of the thickness-extensional or length-extensional modes. The small holes have a variable pattern density and/or distribution in a mass load layer and are placed in the acoustic path. The small holes modify the acoustic path length and change the resonant frequency of the resonator. By varying the pattern density among a plurality of resonators in an array, the acoustic path length and therefore the resonant frequency of each resonator can be individually adjusted. The mass load layer can be either a conductive or dielectric material. Examples of conductive materials include, but are not limited to, tungsten, tungsten alloys, molybdenum, aluminum, iridium, and platinum. Examples of dielectric materials include, but are not limited to, silicon dioxide, silicon nitride, diamond, and amorphous aluminum nitride. Exemplary thicknesses for the mass load layer are in the range of about 50 nm to a few microns. Some embodiments of the present invention introduce holes into the mass load layer to control its mass load layer properties. The density of such holes can vary from 0% (i.e. none) to 50% of the mass load layer. As described herein, the overall frequency shift achieved using holes in a mass load layer can exceed 10000 ppm of the resonator frequency.

In another embodiment, small dimples are etched in a mass load layer or in the upper electrode layer that also functions as a mass load layer. The dimples are designed to not punch through or otherwise extend through the entire thickness of the mass load layer or upper electrode layer. The small dimples have a variable pattern density and/or distribution. The small dimples modify the acoustic path length and change the resonant frequency of the device. Varying the pattern density of the dimples among individual devices in an array of devices permits the resonant frequency of each device in an array to be individually adjusted.

In another specific embodiment, the mass load layer is formed by a reflowable material that is deposited and patterned on a resonator wafer with holes or dimples in a variable pattern density and/or distribution. Then the resonator wafer temperature is elevated above the melting point of the reflowable material. This causes the material to liquefy and fill the holes. Subsequent cooling solidifies the material. Examples of reflowable materials include, but are not limited to, indium, selenium, tin and certain alloys or compounds containing these elements. Varying the pattern density prior to reflow allows the resonant frequency of each resonator in an array of resonators to be adjusted individually.

Preferred embodiments provide a means of introducing controlled changes in the acoustic path length of the resonator by patterning a mass load layer of the resonator. The mass load layer is patterned using a lithographic mask. The mask geometry is configured to pattern a mass load layer in one or more resonators in an array of resonators. The configuration pattern is selected to introduce a pattern into the mass load layer that will change the acoustic path length of the resonator that results in a desired shift in the resonant frequency of the resonator.

Preferred embodiments also provide a means of controlling the acoustic path length that requires only one lithographic (masking) step and one etch step to provide the necessary control within a desired level of accuracy.

There are often underlying variations in resonant frequency across the wafer and between different wafers. However, for many product applications the resonators must have a resonant frequency that is in a specific range; otherwise the part will exhibit a parametric yield failure upon testing. The methods described herein can be used to adjust the resonant frequency of every resonator on a die to a different frequency within a range of a few percent in such a way as to improve the yield in such cases. In general, this would be done by using multiple masks, each of which causes different overall resonant frequency shifts, but which cause the same desired relative frequency shifts between resonators on a single die. After characterization of resonant frequency of multiple resonators across the wafer is achieved by any number of methods known to experts in the art, a photolithography reticle which approximately compensates for the resonant frequency deviation found at a particular reticle site would be selected and used by the lithographic apparatus (e.g., stepper) to pattern the mass load layer as described herein.

The embodiments of the invention are described herein in terms of the materials and methods used to tune resonator devices either individually or with respect to other devices in the array. While the embodiments are described as being formed on a generic substrate, the substrate may incorporate other aspects of the device that incorporates the resonator (e.g. a Bragg reflector) or itself fashioned to form further device features (e.g. etched to form an FBAR). Other conventional aspects for designing and fabricating such devices are well known to those skilled in the art and are not described in detail herein. In this regard, the present application incorporates by reference U.S. patent application Ser. No. 12/002,524, filed Dec. 17, 2008, entitled INTEGRATED ACOUSTIC BANDGAP DEVICES FOR ENERGY CONFINEMENT AND METHODS OF FABRICATING SAME, to Sinha et al. and U.S. patent application Ser. No. 12/321,860, filed Jan. 26, 2009, entitled PROTECTED RESONATOR, to Sinha et al. for other aspects of designing and fabricating acoustic resonator devices.

BRIEF DESCRIPTION OF THE DRAWINGS

A complete understanding of the present invention may be obtained by reference to the accompanying drawings, when considered in conjunction with the subsequent, detailed description, in which.

For purposes of clarity and brevity, like elements and components will bear the same designations and numbering throughout the Figures.

DESCRIPTION OF THE PREFERRED EMBODIMENT

Figure 1:
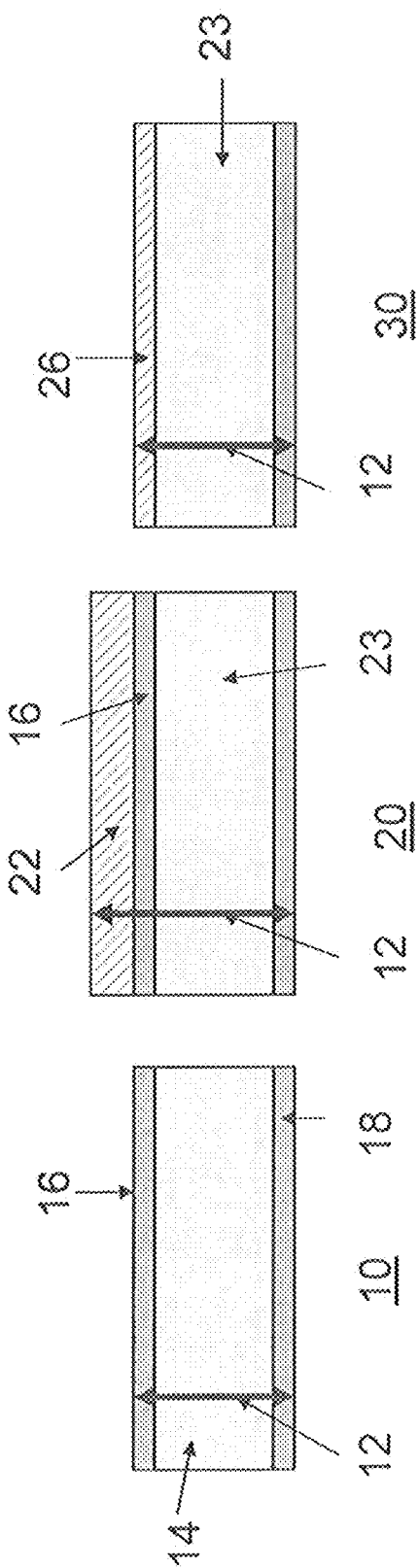
FIG. 1 is a cross section view of a three prior art resonators.

FIG. 1 is a cross section view of a three prior art resonators 10, 20, and 30. These prior art resonators are discussed herein for the purpose of understanding and explaining the advantages of the embodiments of the present invention. The double-ended arrow 12 in each resonator shows the acoustic path of the resonator. The first resonator 10 is the nominal resonator, with a piezoelectric material 14 disposed between a lower electrode 18 and upper electrode 16. The second resonator 20 is modified from the first resonator by adding an extra mass load layer 22 on top of the upper electrode 16. This mass load layer increases the acoustic path 12, as shown by the corresponding arrow. The third resonator 30 is modified from the first resonator 10 by altering the material used for the upper electrode 16. This creates an electrode 26 with altered material properties. This modifies the acoustic path of this resonator compared with resonator 10.

Both the second 20 and the third 30 resonators have a different resonant frequency as compared to the first resonator 10, because of these modifications to the acoustic path. The modifications to the acoustic path are achieved by either adding a separate mass load layer 22 or modifying the thickness or material of the upper electrode 16 as described herein.

Figure 2:
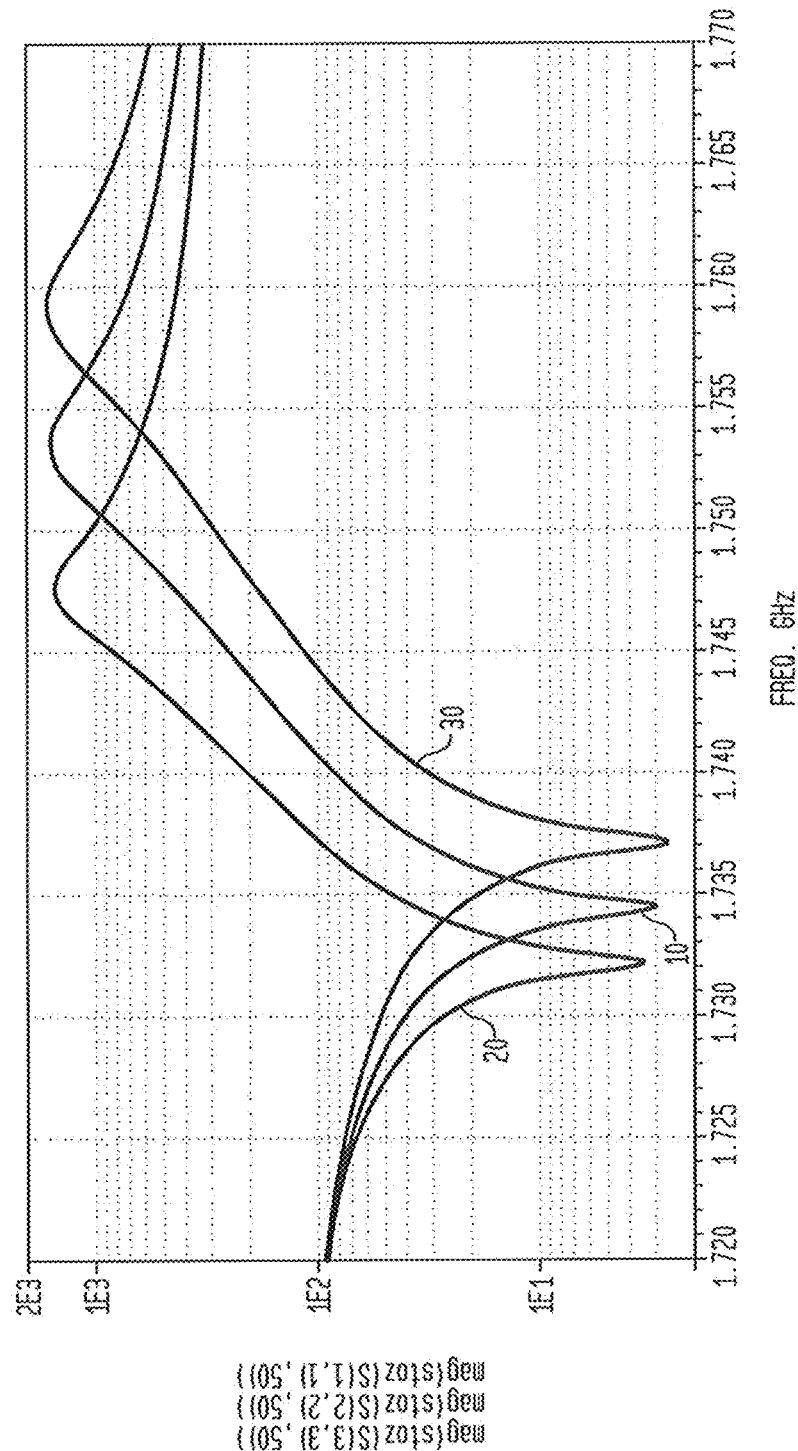
FIG. 2 is a plot of the simulated frequency response of the resonators of FIG. 1.

FIG. 2 is a plot of the simulated frequency response of the prior art resonators of FIG. 1. This illustrates the effect of altering the acoustic path 12 in each resonator illustrated in FIG. 1, which results in a shift in the resonant frequency of the resonators. The nominal resonator response for the resonator 10 is the case when no mass load layer has been applied. For the resonator 20 with mass load layer, the mass-loaded resonator response shows the lengthening of the acoustic path 12 has caused a decrease in the resonant frequency. The resonator 30 with altered material properties and a concomitant change in acoustic path length 12 has demonstrated an increase in the resonant frequency as a result of the change in acoustic path length 12. This is shown in the materially altered resonator response for device 30.

Figure 3:
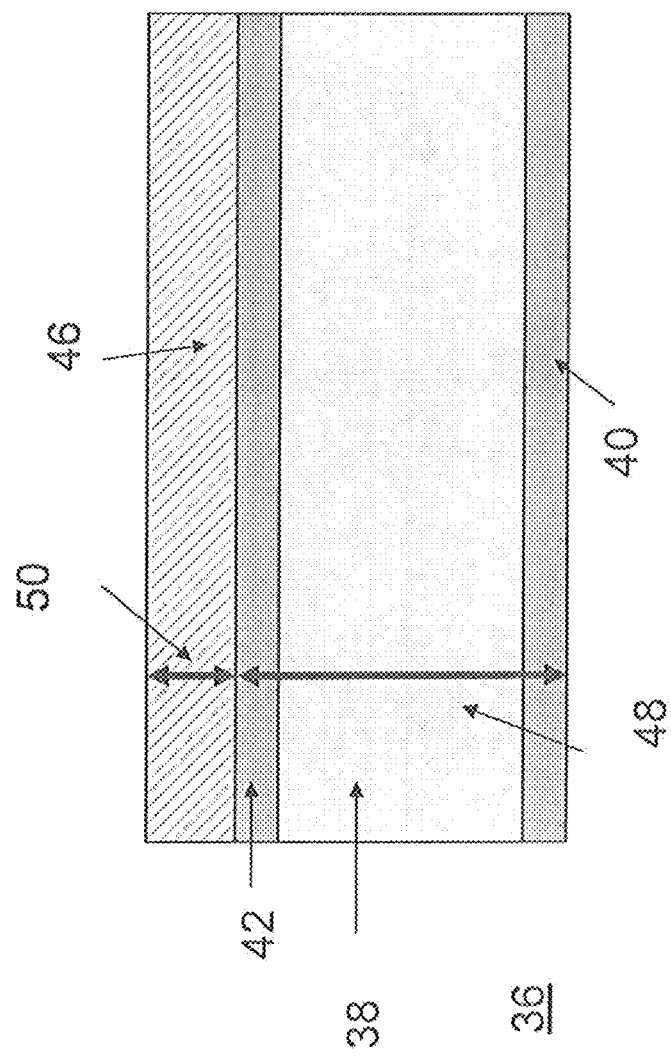
FIG. 3 is a cross section view of device 20 illustrated in FIG. 1, with the primary and secondary acoustic paths separately illustrated.

FIG. 3 is a cross section view of a bulk-acoustic wave resonator 36 with a piezoelectric material 38 disposed between a lower electrode 40 and an upper electrode 42, shown with its associated primary acoustic path 48. An additional mass load layer 46 on top of the upper electrode 42 has a secondary acoustic path 50 that is used to change the overall acoustic path.

Figure 4:
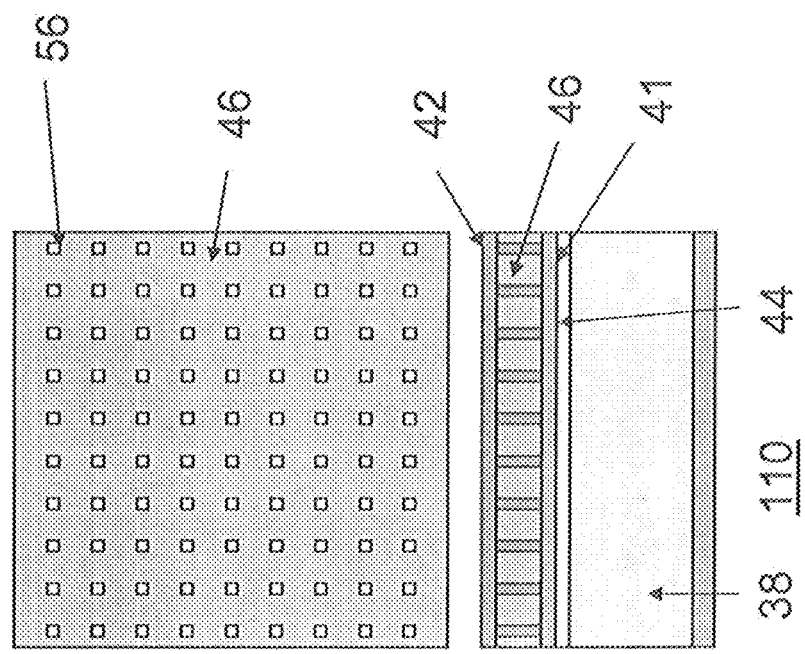
FIG. 4 is a cross section and top view of an array of two resonators according to one embodiment of the present invention.
Figure 4:
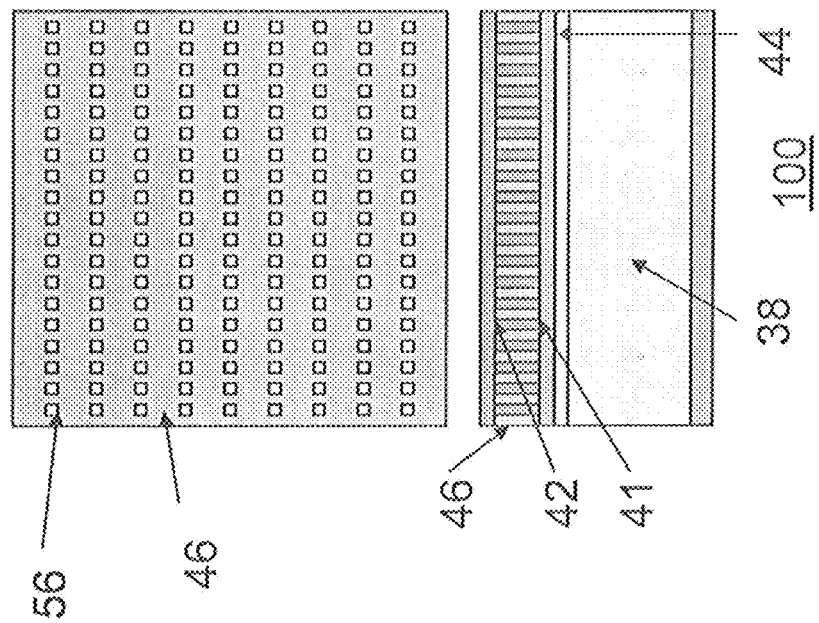

FIG. 4 is a cross section and top view of two bulk acoustic-wave resonators 100 and 110 according to one embodiment of the present invention. Each resonator has a different hole pattern 56 density in a mass load layer 46 under the upper electrode 42. The mass load layer 46 is directly over a thin etch stop layer 41 placed directly on top of the piezoelectric material 38 or the optional temperature drift compensating layer 44. An optional temperature drift compensating layer (not shown) may be placed in the acoustic path, and is typically disposed between the upper electrode 42 and the piezoelectric material 38. The thin etch stop layer 41 is preferably a conductive material. The upper electrode 42 is deposited on top of the patterned mass load layer 46 thereby filling the holes in the mass load layer. Optionally the thin etch stop layer 41 and the upper electrode 42 are both the same material. Also optionally, the mass load layer is a conductive material. The patterned mass load layer 46 defines the portions of the upper electrode 42 to be removed outside the resonator device area. If they are the same material, the upper electrode 42 and the thin etch stop layer 41 are both removed at once outside the resonator device area in the same mask step. This method has the same number of mask steps as a method that patterns a mass load layer 46 and a patterned upper electrode 42 formed thereon. The first patterned resonator 100 has a different hole pattern 56 than the second patterned resonator 110. This results in a different resonant frequency for device 100 than for device 110.

Figure 5:
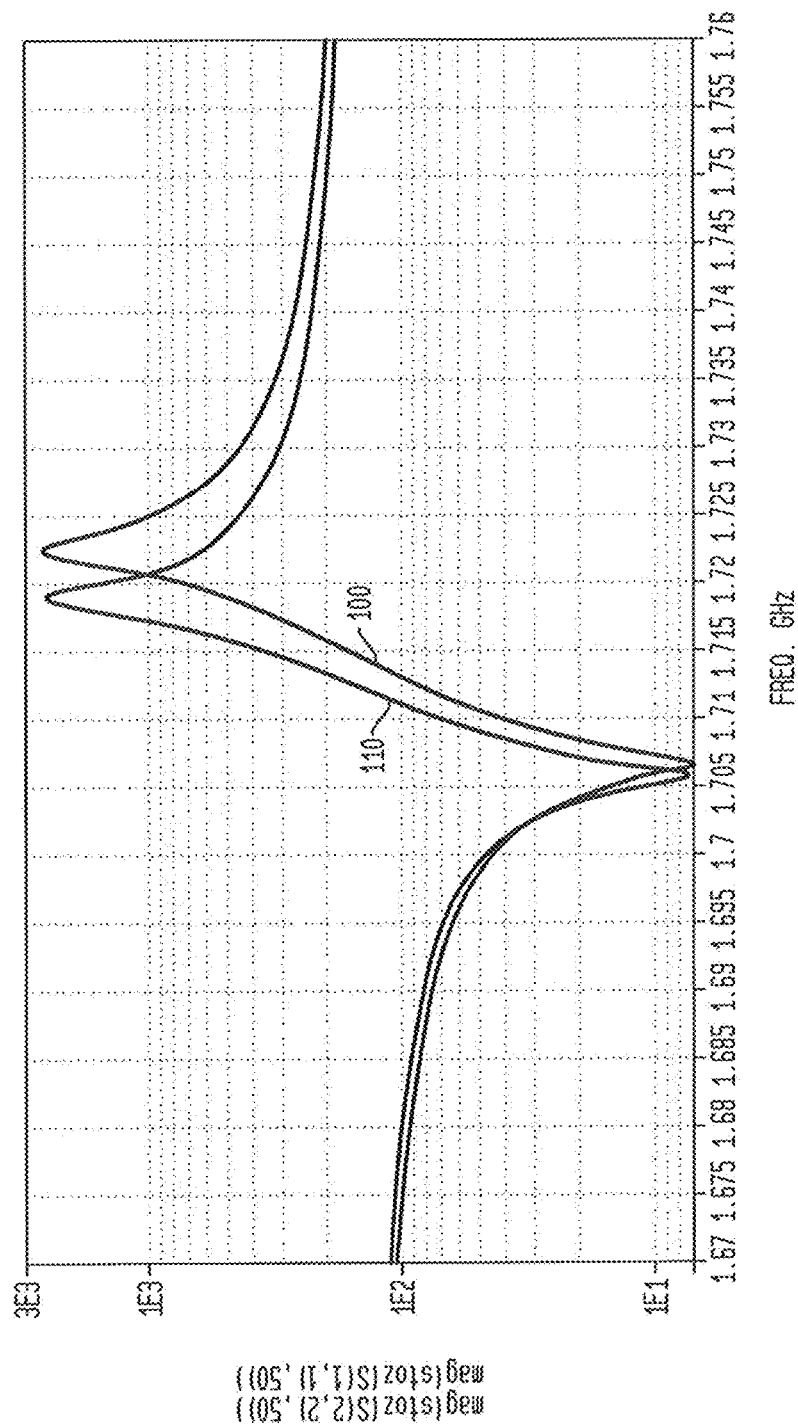
FIG. 5 is a plot of the simulated frequency response of the resonators of FIG. 4.

FIG. 5 is a plot of the simulated frequency response of the resonators 100, 110 of FIG. 4 where the change in secondary acoustic path 50 due to the pattern causes a shift in resonant frequency. The first patterned resonator 100 has a higher resonant frequency than the second patterned resonator 110 because the second mass load layer has fewer holes.

Figure 6:
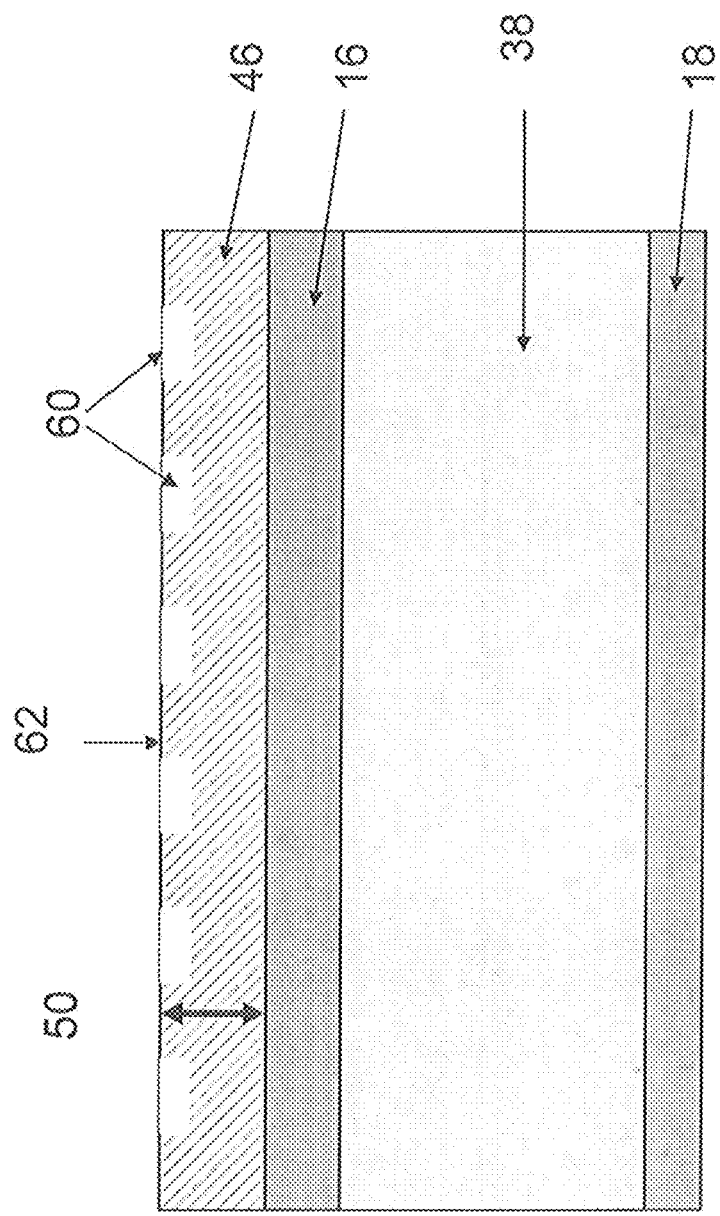
FIG. 6 is a cross section view of a dimpled resonator with dimples etched into upper surface of mass load layers.
Figure 7:
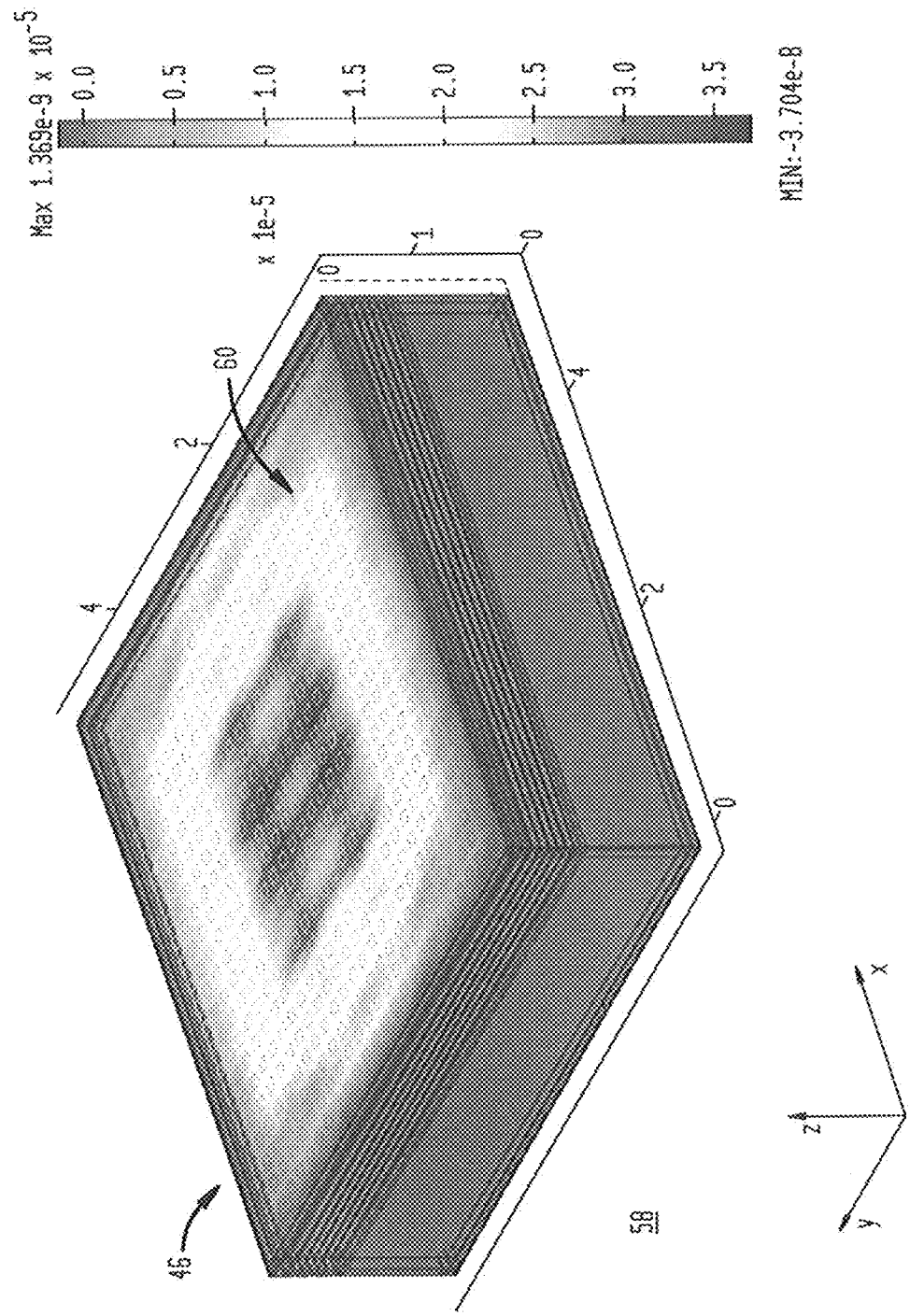
FIG. 7 is a simulation perspective view of a 50 µm by 50 µm dimpled resonator (shown in an SMR configuration) based on FIG. 6.

FIG. 6 is a cross section view of a dimpled resonator 58 with dimples 60 etched into upper surface 62 of mass load layer 46. The dimples 60 extend into mass load layer 46 but not entirely through the layer. These dimples change the secondary acoustic path 50 and the resonant frequency for the resonator 58 compared to a resonator that does not have a dimpled mass load. One skilled in the art will appreciate that the mass load layer can be dimpled or patterned by adding or removing material thereto using standard techniques for depositing (e.g. CVD) or removing (e.g. etching). Techniques for adding or removing material in a pattern are well known to the skilled person and not described in detail herein FIG. 7 is a three dimensional simulation perspective view of a 50 μm by 50 μm dimpled resonator 58 (shown in an SMR configuration) based on the resonator illustrated on FIG. 6. Dimples 60 are etched into the mass-load layer 46. Shading indicates the simulated vertical displacement (wave propagation along the primary acoustic path (48 in FIG. 3) and secondary acoustic path (50 in FIG. 3)). The simulation results indicate that the displacement is not degraded by the presence of the dimples 60, as compared to a resonator 10 without such dimples.

Figure 8:
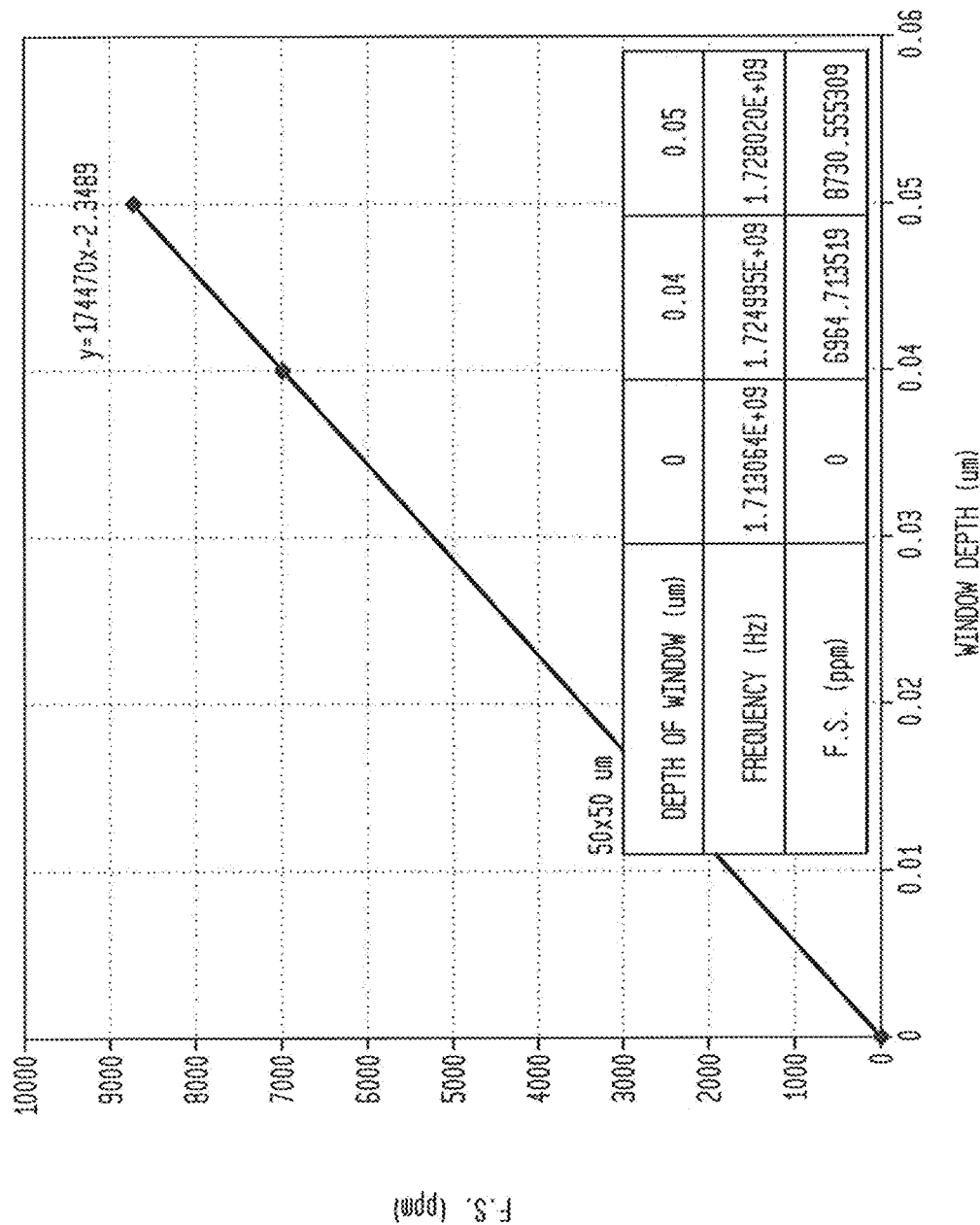
FIG. 8 is a plot of the simulated change of resonant frequency as a function of dimple depth for the 50 µm by 50 µm resonator illustrated on FIG. 6.

FIG. 8 is a plot of the simulated change of resonant frequency as a function of dimple depth of a 50 um by 50 um resonator based on the resonator illustrated on FIG. 6. Up to an almost 9000 ppm change on the resonant frequency shift is demonstrated when the dimple depth 66 is 50 nm (0.5 μm), as shown in the table inset into FIG. 8.

Figure 9:
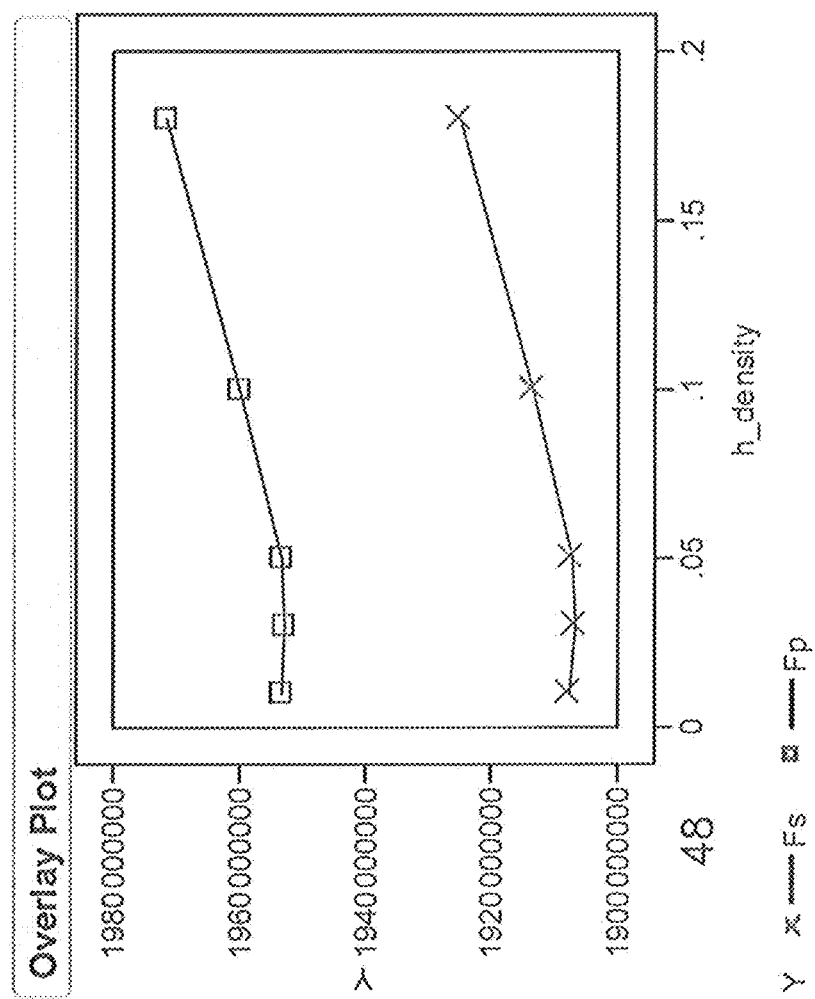
FIG. 9 is a plot of the measured resonant frequency of a 200 µm by 200 µm resonator, as illustrated on FIG. 6, as a function of dimple density.

FIG. 9 is a plot of the measured resonant frequency of a 200 um by 200 um dimpled resonator based on the resonator illustrated on FIG. 6. FIG. 9 illustrates the change in resonant frequency due to a change in dimple density. Each dimple is 1 um by 1 um. Nearly 8000 ppm of frequency shift is demonstrated when the dimple density increases from 0.01 per unit volume to 0.18 per unit volume.

In addition to the series resonance (referred herein, when there is no ambiguity, simply as the resonance), the resonator exhibits another resonance, known as the parallel resonance, which manifests itself when the resonator behaves like an open circuit (or almost open circuit) between its two electrodes. The series resonant frequency is noted Fs or fs. The parallel resonant frequency is noted Fp or fp. The parallel resonant frequency depends on both the acoustic as well as the dielectric properties of the constituent materials. The series and the parallel resonant frequencies together determine an important metric of resonator performance, the resonator coupling coefficient k2. A commonly used equation that relates k2 to fs and fp is $k2=(pi/2)*(fs/fp)*cot((pi/2)*(fs/fp))$. FIG. 9 illustrates that there is no appreciable change in the value of k2 when the series resonant frequency is adjusted by the method described above because the parallel resonant frequency tracks with the series resonant frequency.

Figure 10:
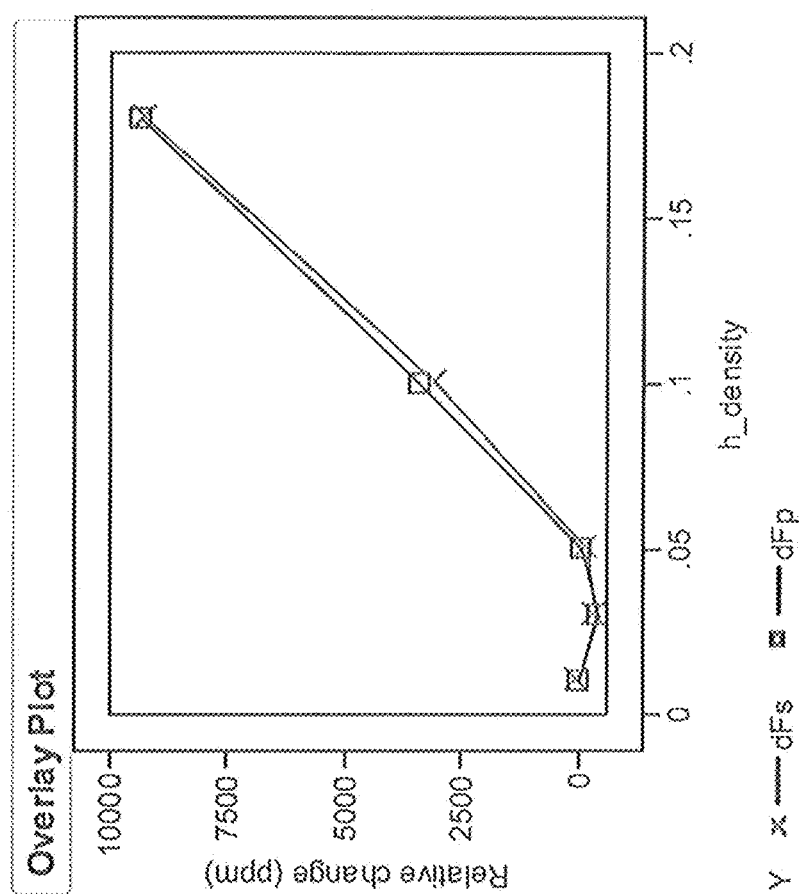
FIG. 10 is a plot of the measured change of resonant frequency of a 200 µm by 200 µm resonator, as illustrated on FIG. 6, as a function of dimple density.

FIG. 10 is a plot of the measured change of resonant frequency of a 200 um by 200 um resonator based on the resonator illustrated on FIG. 6. This figure expresses in MHz the same result shown in FIG. 9.

Figure 11:
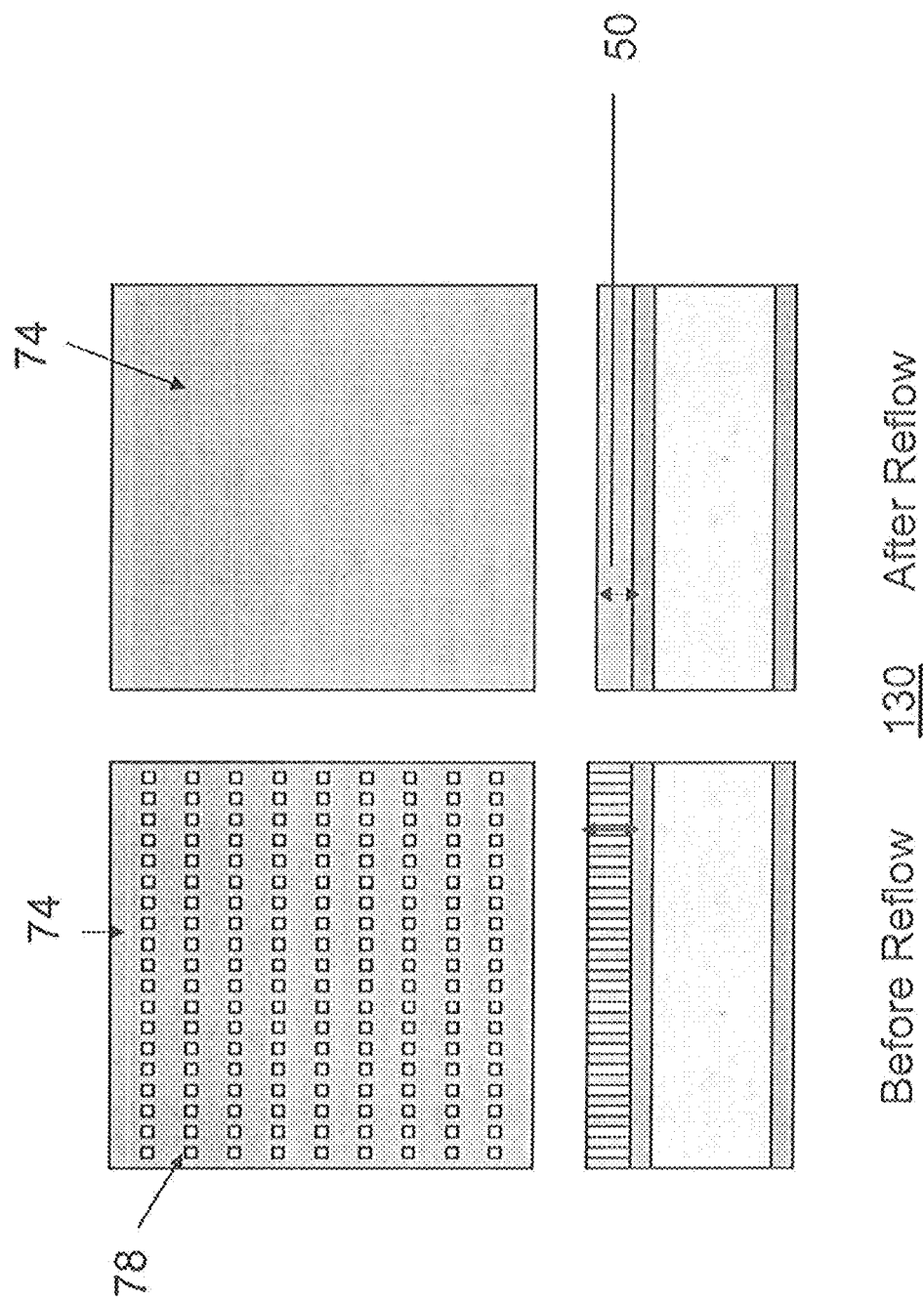
FIG. 11 is a cross section and top view of a resonator with a reflowable material used as the mass load layer.

FIG. 11 is a cross section and top view of a resonator 130 with a reflowable material 74 used as the mass load layer, before and after the reflow operation. Before the reflow, holes 78 are visible in the reflow layer. After reflow, the holes are no longer visible with an attendant reduction in the overall reflow material 74 mass load layer thickness.

Figure 12:
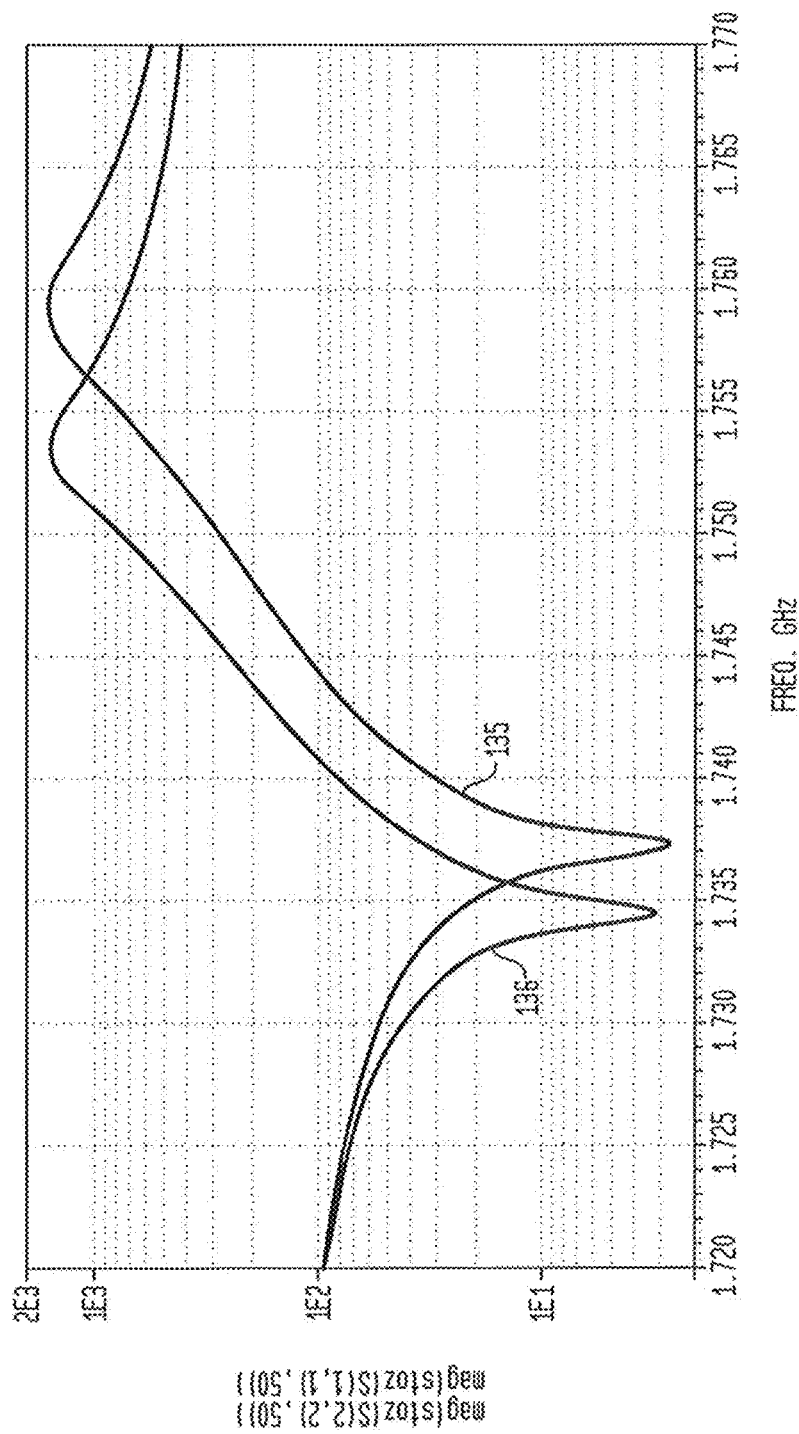
FIG. 12 is a plot of the simulated frequency response of the resonator with a reflowable material illustrated in FIG. 11.

FIG. 12 is a plot of the simulated frequency response of the resonator with a reflowable material 74 of FIG. 11. The effect of two different hole densities in the reflow material results in a different secondary acoustic path 50 for the resonator before and after reflow, the resonant frequency 135 before reflow is higher than the resonant frequency 136 after reflow.

Some additional aspects of the present invention are described below. In one embodiment an array of resonators is provided. The resonators have a portion that converts electrical energy to mechanical energy or mechanical energy to electrical energy. In a preferred embodiment, this portion is a layer of piezoelectric material. The resonators also have a portion that collects charge over the bottom surface of the piezoelectric material. This portion is in direct contact to the portion that converts electrical energy to mechanical energy (or vice-versa). In a preferred embodiment, the charge collector is a bottom electrode. In certain embodiments, the resonators also have a portion that collects charge over the upper surface of the piezoelectric material and, optionally, also acts as an etch stop for a mass load material etch described below. In preferred embodiments this portion that collects charge on the upper surface is an upper electrode. In other embodiments the upper electrode does not act as an etch stop.

Disclosed herein are many mechanisms to adjust the incremental acoustic path length of the resonator. Generally these mechanisms pattern or tailor a portion termed a mass load portion or layer that is directly deposited on the portion that collects charge over the upper surface of the piezoelectric material (and optionally acts as an etch stop for the mass load material etch). The mass load layer, as described above, provides a secondary acoustic path in addition to the primary acoustic path which is found in the piezoelectric material and the conductive layers between which the piezoelectric material is disposed.

The resonator so configured has a path over which a particular acoustic resonant mode propagates. The disclosed mechanisms are used to modify the overall acoustic path length (but primarily affecting the secondary acoustic path length by manipulating the properties of the mass load layer) across an array of bulk-acoustic wave resonator. One mechanism removes portions of the mass load layer through its thickness to impart a desired secondary acoustic path length change to the resonator, and hence a change in its resonant frequency. In one embodiment the mass load material is removed by etching. In another embodiment, a portion or portions of the upper surface of the mass load layer are removed to achieve the desired change in the secondary acoustic path length, and hence a change in resonant frequency. In either embodiment, a pattern is introduced into the mass load layer (either in its surface or through its thickness) to achieve a desired change in the secondary acoustic path length for the device. In one embodiment, the portion of the surface of the mass load layer is removed by etching.

In another embodiment, the mass load layer is patterned and then melted or otherwise induced to a malleable or flowable state to adjust the acoustic path of the resonator to obtain the desired change in resonant frequency. Mechanisms for molding or otherwise shaping the flowable mass load layer are well known to one skilled in the art and are not described in detail herein. In one embodiment of this method a mass load layer material that is reflowable at elevated temperature is deposited and patterned using lithography as described above. The resonator with the mass load layer thereon is then heated, causing the mass load layer to fill in the pattern. The pattern is selected to effect a desired change in the resonant frequency of the resonator by adjusting the acoustic path length in the device. In this method, the pattern is selected to ensure that the desired change in the acoustic path length is achieved after reflow. Consequently, factors such as the uniformity of the pattern and the amount of material removed relative to amount of material remaining are factors to be considered in determining the appropriate pattern. In one embodiment, the reflowable material is patterned by etching. Also, the reflowable material is selected to have a low melting point but yet be stable (i.e. not melt) at the operating temperature.

In the above described methods, the goal is to achieve a stable configuration and uniform mass load layer thickness in the operating temperature range that achieves the desired secondary acoustic path length change, and hence the desired change in resonant frequency for the resonator. The methods are chosen because the deposition and patterning steps can be customized for multiple resonators in an array, thus providing the ability to achieve a different adjustment in resonant frequency for each resonator in the array. As stated above, factors to be considered when selecting the materials and conditions for a particular method are stability and uniformity of the mass load layer for each individual resonator.

In the embodiments described above one example of a resonator is a bulk-acoustic wave resonator. The skilled person is aware of other applicable resonator structures to which are applicable to the present invention.

In the embodiments described above, one example of the material that converts electrical energy to mechanical energy (and vice versa) is a piezoelectric material.

In the embodiments described above, one example of a suitable material for the etch stop formed on or with the upper electrode is a conductive thin etch stop layer.

In the methods described above, the patterning is preferably accomplished in a single lithography step followed by a single etch step.

In the embodiments described above, the path over which a particular acoustic resonant mode propagates is a fixed primary acoustic path.

For an array of resonators, the methods described above for modifying the acoustic path and hence the resonant frequency of each resonator in the array is also used to modify the overall acoustic path across the array of bulk-acoustic wave resonators. According to the above methods, the material and properties of a mass load layer are controlled to achieve a desired secondary acoustic path length for one or more resonators in the array. These changes are selected to achieve a desired acoustic path length across the array of resonators.

In the embodiment described above wherein a portion of the upper surface of the mass load layer is removed by lithography followed by an etch step, the surface that results is a dimpled surface with a plurality of preferably evenly distributed depressions (e.g. dimples) therein. The depth size and distribution of the dimples are selected to bring about the desired change in the secondary acoustic path length of the resonator, and hence the desired change in resonant frequency.

As described above, the array of resonators described herein optionally have a temperature drift compensating layer. It is well known that most materials have a negative derivative of acoustic velocity with regard to temperature. In order to balance this effect, a layer of material with a positive derivative of acoustic velocity with regard to temperature is provided (in one embodiment this layer is a layer of silicon dioxide). In preferred embodiments, the thickness and material of the temperature drift compensating layer is selected so that the overall effect of a change in temperature on acoustic velocity (which manifests as a change in resonant frequency of the resonator device) is zero.

The temperature drift compensating layer is optionally disposed between the upper electrode and the piezoelectric material. The purpose of the temperature drift compensating layer is to provide a gross compensation in the temperature coefficient of frequency of the resonator. That is, if the temperature coefficient of the resonator would otherwise change as a result of a change in operating temperature, the temperature drift compensation layer keeps the temperature coefficient at zero. In certain embodiments, the temperature drift compensating layer is deposited on the thin etch stop layer, which is deposited on the top electrode.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method for forming a resonator comprising:
   forming a first conductive layer on a substrate;
   forming a layer for converting one of electrical energy or mechanical energy to the other on the first conductive layer;
   forming over said layer for converting one of electrical energy or mechanical energy to the other a mass load layer for adjusting the acoustic path length of the resonator to achieve a desired predetermined resonant frequency;
   patterning the mass load layer by one of adding material thereto to form apertures therein that extend partially into the mass load layer or removing material to form apertures that extend at least one of either partially into or entirely through the mass load layer; and
   forming a second conductive layer on the mass load layer, wherein at least a portion of the apertures that extend entirely through the mass load layer are filled by the second conductive layer material.

2. The method of claim 1 wherein the layer for converting one of electrical energy or mechanical energy to the other is a piezoelectric layer.

3. The method of claim 2 wherein the first and second conductive layers are first and second electrodes.

4. The method of claim 3 wherein the resonator is a resonator array.

5. The method of claim 4 wherein the pattern of the mass load layer of a first resonator in the array has a first pattern density and the pattern of the mass load layer for a second resonator in the array has a second pattern density different from the first pattern density, wherein the pattern density is selected to impart a predetermined acoustic path length to each resonator.

6. The method of claim 3 wherein the patterned mass load layer has apertures therein at least a portion thereof having dimensions smaller than the acoustic wavelength of a thickness-extensional mode or a length-extensional mode of the resonator.

7. The method of claim 3 wherein the pattern of the mass load layer has a variable density.

8. The method of claim 1 wherein the second conductive layer at least partially fills the apertures in the mass load layer.

9. The method of claim 1 wherein the resonator is a bulk acoustic-wave resonator.

10. The method of claim 1, further comprising forming an etch stop layer on the layer for converting one of electrical energy or mechanical energy to the other and forming the mass load layer over the etch stop layer.

11. The method of claim 1, wherein the mass load layer is patterned using a single lithography step followed by a single etch step.

12. The method of claim 1 further comprising forming a temperature drift compensating layer in the resonator.

13. The method of claim 1 further comprising heating the mass load layer to a deformable or flowable state such that the patterned mass load layer at least partially moves into the apertures therein.

14. The method of claim 13 further comprising cooling the mass load layer after the heating step.

15. A method for forming a resonator comprising:
   forming a first conductive layer on a substrate;
   forming a layer of piezoelectric material over the first conductive layer;
   forming a second conductive layer over the layer of piezoelectric material;
   forming over said second conductive layer a mass load layer;
   patterning the mass load layer by adding material to the mass load layer, thereby introducing apertures into the mass load layer, wherein the apertures extend only partially through the mass load layer, wherein the pattern is selected to provide a predetermined resonant frequency to the resonator, wherein the resonator is an array of resonators and the pattern of the mass load layer of a first resonator in the array has a first pattern density and the pattern of the mass load layer for a second resonator in the array has second pattern density different from the first pattern density, wherein the pattern density is selected to impart a predetermined acoustic path length to the resonator.

16. The method of claim 15 wherein at least a portion of the apertures in the patterned mass load layer have dimensions smaller than the acoustic wavelength of a thickness-extensional mode or a length-extensional mode of the resonator.

17. The method of claim 15 wherein the pattern of the mass load layer has a variable density.

* * * * *